United States Patent
Wakisaka et al.

(10) Patent No.: US 11,508,630 B2
(45) Date of Patent: Nov. 22, 2022

(54) THIN FILM ANALYZING DEVICE AND THIN FILM ANALYZING METHOD

(71) Applicant: Kioxia Corporation, Tokyo (JP)

(72) Inventors: Yuki Wakisaka, Mie (JP); Yuji Yamada, Mie (JP); Sho Kato, Mie (JP); Takumi Nishioka, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 274 days.

(21) Appl. No.: 17/010,029

(22) Filed: Sep. 2, 2020

(65) Prior Publication Data

US 2021/0262951 A1    Aug. 26, 2021

(30) Foreign Application Priority Data

Feb. 20, 2020 (JP) .............................. JP2020-027195

(51) Int. Cl.
*G01N 23/20025* (2018.01)
*G01N 23/223* (2006.01)
*H01L 21/306* (2006.01)
*H01L 21/66* (2006.01)
*G01N 23/207* (2018.01)
*B24B 37/013* (2012.01)
*H01L 21/67* (2006.01)

(52) U.S. Cl.
CPC ............ *H01L 22/12* (2013.01); *B24B 37/013* (2013.01); *G01N 23/207* (2013.01); *G01N 23/20025* (2013.01); *G01N 23/223* (2013.01); *H01L 21/30625* (2013.01); *H01L 21/67253* (2013.01); *H01L 22/26* (2013.01); *G01N 2223/052* (2013.01); *G01N 2223/607* (2013.01); *G01N 2223/6116* (2013.01)

(58) Field of Classification Search
None
See application file for complete search history.

(56) References Cited

U.S. PATENT DOCUMENTS

| | | | |
|---|---|---|---|
| 6,629,879 B1 * | 10/2003 | Kim | H01L 21/3212 451/6 |
| 10,989,678 B2 * | 4/2021 | Kono | G01N 23/223 |
| 2009/0239314 A1 * | 9/2009 | Haberjahn | H01L 22/26 257/E21.528 |
| 2020/0408706 A1 * | 12/2020 | Kono | G01N 23/2202 |
| 2021/0262951 A1 * | 8/2021 | Wakisaka | H01L 21/67253 |

FOREIGN PATENT DOCUMENTS

| | | | | |
|---|---|---|---|---|
| EP | 2562800 A2 * | 2/2013 | ....... | H01L 21/67086 |
| JP | H05287531 A * | 11/1993 | | |
| JP | 2004356223 A * | 12/2004 | ....... | H01L 21/30604 |
| JP | 2017-129370 A | 7/2017 | | |
| WO | WO-2022102153 A1 * | 5/2022 | ........... | G01N 23/223 |

* cited by examiner

Primary Examiner — Thomas R Artman
(74) Attorney, Agent, or Firm — Foley & Lardner LLP

(57) ABSTRACT

A thin film analyzing device includes a processing and analyzing chamber for performing processing and analyzing of a subject having a thin film on a substrate. The processing and analyzing chamber includes a sample holder arranged to hold the subject, an X-ray irradiation source arranged to irradiate the subject with X-rays, a fluorescent X-ray detector configured to detect fluorescent X-rays which are emitted from the subject, a diffracted/reflected X-ray detector configured to detect reflected X-rays and diffracted X-rays which are emitted from the subject, and a substrate remover arranged to remove the substrate.

19 Claims, 7 Drawing Sheets

THIN FILM ANALYZING DEVICE AND THIN FILM ANALYZING METHOD

CROSS-REFERENCE TO RELATED APPLICATION

This application is based upon and claims the benefit of priority from Japanese Patent Application No. 2020-027195, filed Feb. 20, 2020, the entire contents of which are incorporated herein by reference.

FIELD

Embodiments described herein relate generally to a thin film analyzing apparatus and a thin film analyzing method.

BACKGROUND

A fluorescent X-ray analysis device is known as a device for analyzing a composition of a thin film formed on a semiconductor substrate.

DETAILED DESCRIPTION

At least one embodiment provides a thin film analyzing device and a thin film analyzing method, in which it is possible to accurately and efficiently analyze a composition of a thin film formed on a semiconductor substrate.

In general, according to at least one embodiment, a thin film analyzing device includes a processing and analyzing chamber for performing processing and analysis of a subject having a thin film on a semiconductor substrate. The processing and analyzing chamber includes a holder arranged to hold the subject, an X-ray irradiation source arranged to irradiate the subject with X-rays, a fluorescent X-ray detector configured to detect fluorescent X-rays which are emitted from the subject due to irradiation of the X-rays, a diffracted/reflected X-ray detector configured to detect reflected X-rays and diffracted X-rays which are emitted from the subject due to the irradiation of the X-rays, and a substrate remover arranged to remove the semiconductor substrate.

Hereinafter, embodiments of the present disclosure will be described with reference to the drawings.

First Embodiment

Figure 1:
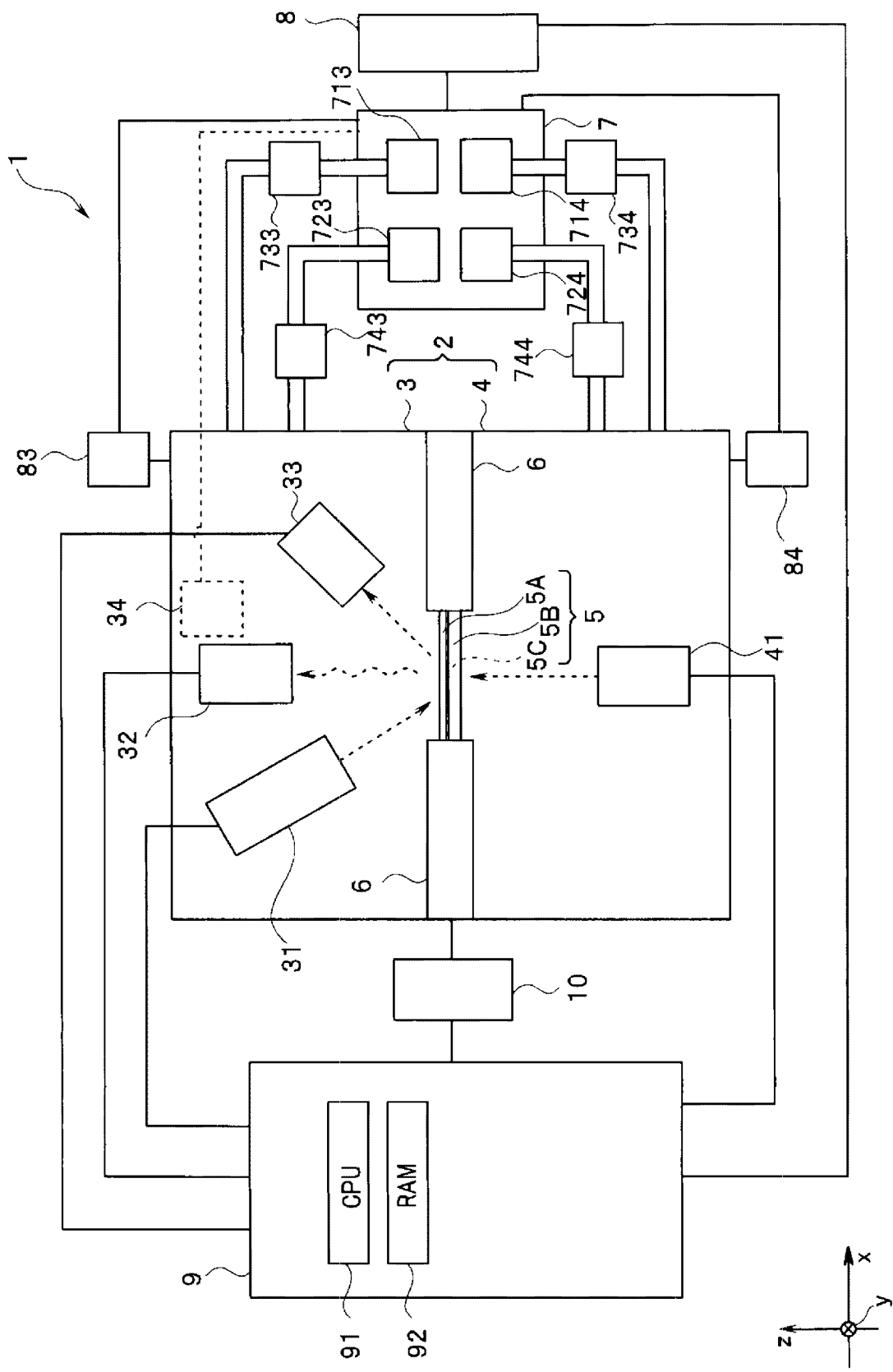
FIG. 1 a block diagram showing a configuration example of a thin film analyzing device according to a first embodiment.

FIG. 1 is a block diagram showing a configuration example of a thin film analyzing device according to the first embodiment. A thin film analyzing device 1 of this embodiment includes an analyzing and processing chamber 2 and is used for analysis of the composition of a film formed on the surface of a subject 5 (specifically, a thin film 5A formed on a substrate 5B).

In this embodiment, the analyzing and processing chamber 2 is a chamber for performing X-ray irradiation and detection. More specifically, the analyzing and processing chamber 2 is a chamber for performing thin film analysis by X-ray fluorescence spectroscopic analysis (X-ray fluorescence, hereinafter referred to as XRF), X-ray diffraction analysis (X-ray Diffraction, hereinafter referred to as XRD), and X-ray reflectivity analysis (X-ray Reflectivity, hereinafter referred to as XRR). The analyzing and processing chamber 2 is divided into an analyzing chamber 3 and a processing chamber 4 with a sample holding unit (holder) 6 holding the subject 5 as a boundary. In the following description, two orthogonal directions parallel to the surface of the subject 5 at the time of executing the XRF/XRD/XRR analysis are defined as an x direction and a y direction. Further, the direction orthogonal to an x-y plane including the x direction and the y direction is defined as a z direction.

The XRF is a method of irradiating a subject with X-rays, detecting the fluorescent X-rays which are generated from the subject due to the irradiation, and analyzing the subject, based on the energy of the detected fluorescent X-rays. It is a method that can analyze the composition of a thin film in a macroscopic region and perform evaluation with good reproducibility in a short time. On the other hand, in the XRF analysis, if the fluorescent X-rays of an element in a target thin film and an element constituting a substrate under the thin film interfere with each other, accurate measurement of the fluorescent X-rays which are generated from the subject is difficult, and an accurate analysis becomes difficult. For example, in a case of analyzing the composition of a CoSi (cobalt silicide) film formed on the surface of a Si (silicon) substrate, in order to perform accurate measurement, the Si substrate is removed in an inspection region and then analysis of the CoSi film is performed. The analyzing and processing chamber 2 of at least one embodiment includes a mechanism that performs XRD/XRR analysis in addition to the XRF analysis, and a mechanism that removes the substrate 5B under the thin film 5A in the inspection region. In this embodiment, the size of the subject 5 is, for example, in a range of about 1 centimeter square to several centimeters square, and the size of the inspection region is in a range of about 10 microns square to several millimeters square.

The processing chamber 4 is a chamber for removing the substrate 5B under the thin film 5A in the inspection region prior to the analysis of the thin film 5A or in parallel with the analysis of the thin film 5A. Further, the analyzing chamber 3 is a chamber for performing the analysis of the thin film 5A after the processing of the subject 5 and performing end point detection when removing the substrate 5B under the thin film 5A. The pressure or the atmosphere in each of the analyzing chamber 3 and the processing chamber 4 can be independently controlled. The pressures in the analyzing chamber 3 and the processing chamber 4 are adjusted by a pressure control unit (controller) 7. The detailed configuration of the pressure control unit 7 will be described later.

The analyzing chamber 3 is provided with an X-ray irradiation unit (source) 31, a fluorescent X-ray detection unit (detector) 32, a diffracted/reflected X-ray detection unit (detector) 33, and a pressure sensor 83. The analyzing chamber 3 may be provided with a thin film strain detection unit 34.

The X-ray irradiation unit 31 is composed of a predetermined X-ray tube. In the X-ray tube, for example, thermoelectrons generated from a filament (cathode) inside the tube are accelerated by a voltage applied between the filament (cathode) and a target (anode), and X-rays generated by collision of the thermoelectrons with W (tungsten), rhodium (Rh), Mo (molybdenum), Cr (chromium), Cu (copper), or the like, which is a target, are emitted as primary X-rays from a window such as beryllium foil. The X-rays emitted from the X-ray irradiation unit 31 are applied to the subject 5 fixed by the sample holding unit 6.

For the fluorescent X-ray detection unit 32, for example, a semiconductor detector is used. The fluorescent X-ray detection unit 32 detects fluorescent X-rays which are generated from the subject 5 by the X-rays emitted from the X-ray irradiation unit 31, and outputs a current value proportional to the energy of the detected fluorescent X-rays to an information processing device 9. That is, the fluorescent X-ray detection unit 32 may be used for the analysis of the composition of the thin film 5A formed on the surface of the subject 5. For the fluorescent X-ray detection unit 32, detectors other than the semiconductor detector, for example, the combination of a scintillation counter, a proportional counter, or the like with an appropriate spectroscope may be used.

For the diffracted/reflected X-ray detection unit 33, for example, a semiconductor detector such as a CCD detector may be used. The diffracted/reflected X-ray detection unit 33 detects diffracted X-rays or reflected X-rays which are generated from the subject 5 by the X-rays emitted from the X-ray irradiation unit 31 and incident on the subject 5. Then, the diffracted/reflected X-ray detection unit 33 outputs a current value proportional to the intensity of the detected X-rays to the information processing device 9. That is, the diffracted/reflected X-ray detection unit 33 is used for the analysis of the crystal structure of the subject 5 by the X-ray diffraction analysis (X-ray Diffraction, XRD) described above, or the analysis of the reflectivity of the subject 5 by the X-ray reflectivity analysis (X-ray Reflectivity, XRR) described above. In at least one embodiment, the analysis result (the crystal structure analysis result or the reflectivity analysis result for the subject 5) using the output of the diffracted/reflected X-ray detection unit 33 is also used for the end point detection when removing the substrate 5B under the thin film 5A. For the diffracted/reflected X-ray detection unit 33, detectors other than the semiconductor detector, for example, a scintillation counter, a proportional counter, or the like may be used.

The thin film strain detection (detector) unit 34 detects strain of the surface of the subject 5. As the thin film strain detection unit 34, for example, a white light interferometer or the like may be used. The white light interferometer detects strain of the surface by using the reflected light from the subject 5, which is obtained when the surface of the subject 5 is irradiated with white light. The detection result is output to the pressure control unit 7. The thin film strain detection unit 34 may be a detector other than the white light interferometer as long as it is a device that can detect the surface strain without contact. Further, the thin film strain detection unit 34 is not an essential element of the analyzing chamber 3.

The pressure sensor 83 monitors the pressure in the analyzing chamber 3. The pressure value is output to the pressure control unit 7.

The processing chamber 4 is provided with a substrate removing/cleaning unit 41 and a pressure sensor 84. The substrate removing/cleaning unit 41 has a mechanism capable of realizing an etching technique such as dry etching or wet etching. For example, the substrate removing/cleaning unit 41 has a mechanism that performs dry etching using a laser, a mechanism that performs wet etching that supplies a chemical liquid for selectively removing the substrate 5B, a mechanism that performs mechanical etching using a polishing pad, or the like.

Figure 2:
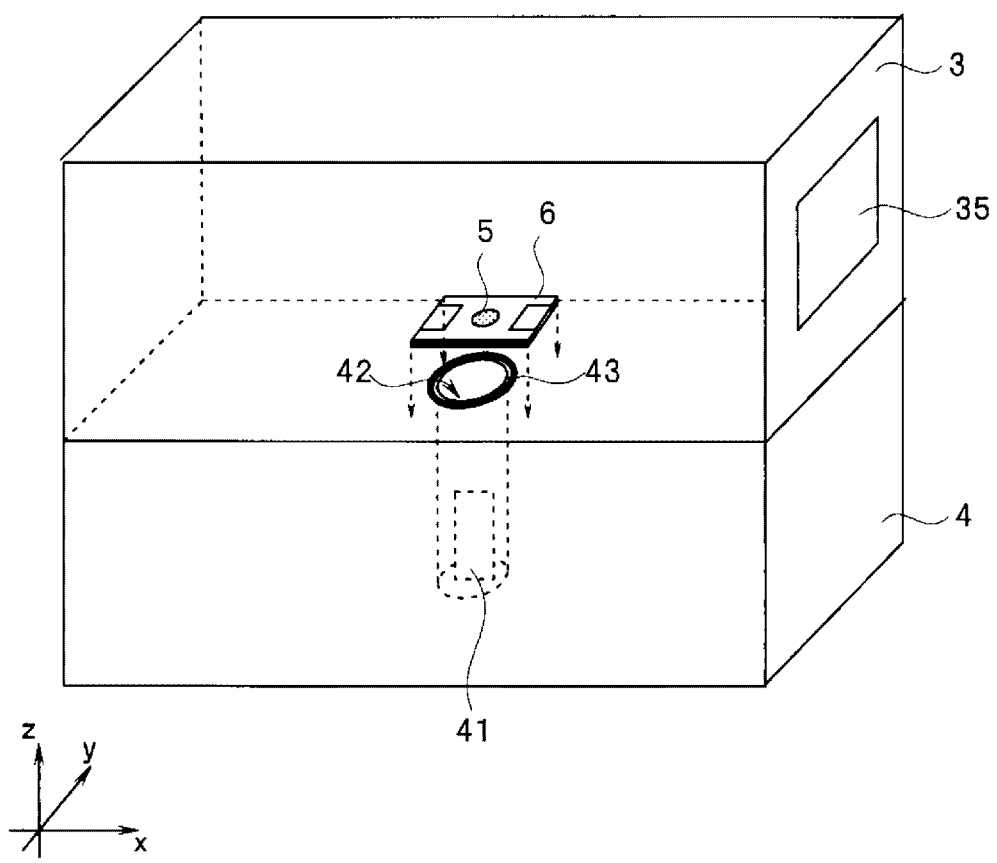
FIG. 2 is a schematic diagram showing an example of a structure of a processing chamber according to the first embodiment.

FIG. 2 is a schematic diagram showing an example of the structure of the analyzing chamber and the processing chamber according to the first embodiment. As shown in FIG. 2, the analyzing chamber 3 is provided with a port 35 for loading/unloading the subject 5. The subject 5 is loaded into the analyzing chamber 3 through the port 35 and held on the sample holding unit 6. The port 35 can hermetically seal the space inside the analyzing chamber 3 in a state where the subject 5 is held on the sample holding unit 6. In FIG. 2, the X-ray irradiation unit 31, the fluorescent X-ray detection unit 32, the diffracted/reflected X-ray detection unit 33, the pressure sensor 83, and the thin film strain detection unit 34, which are provided in the analyzing chamber 3, are not shown.

An opening 42 is formed in the lower surface in the z direction of the analyzing chamber 3, which corresponds to the upper surface in the z direction of the processing chamber 4. A seal member 43 is disposed around the opening 42. The substrate removing/cleaning unit 41 is disposed below the opening 42 in the z direction. The sample holding unit 6 holding the subject 5 is disposed on the upper surface in the z direction of the processing chamber 4, and the opening 42 is covered with the subject 5 and the sample holding unit 6, so that the sample holding unit 6 and the seal member 43 are brought into close contact with each other, whereby the analyzing chamber 3 and the processing chamber 4 are configured as independent closed spaces.

Figure 3:
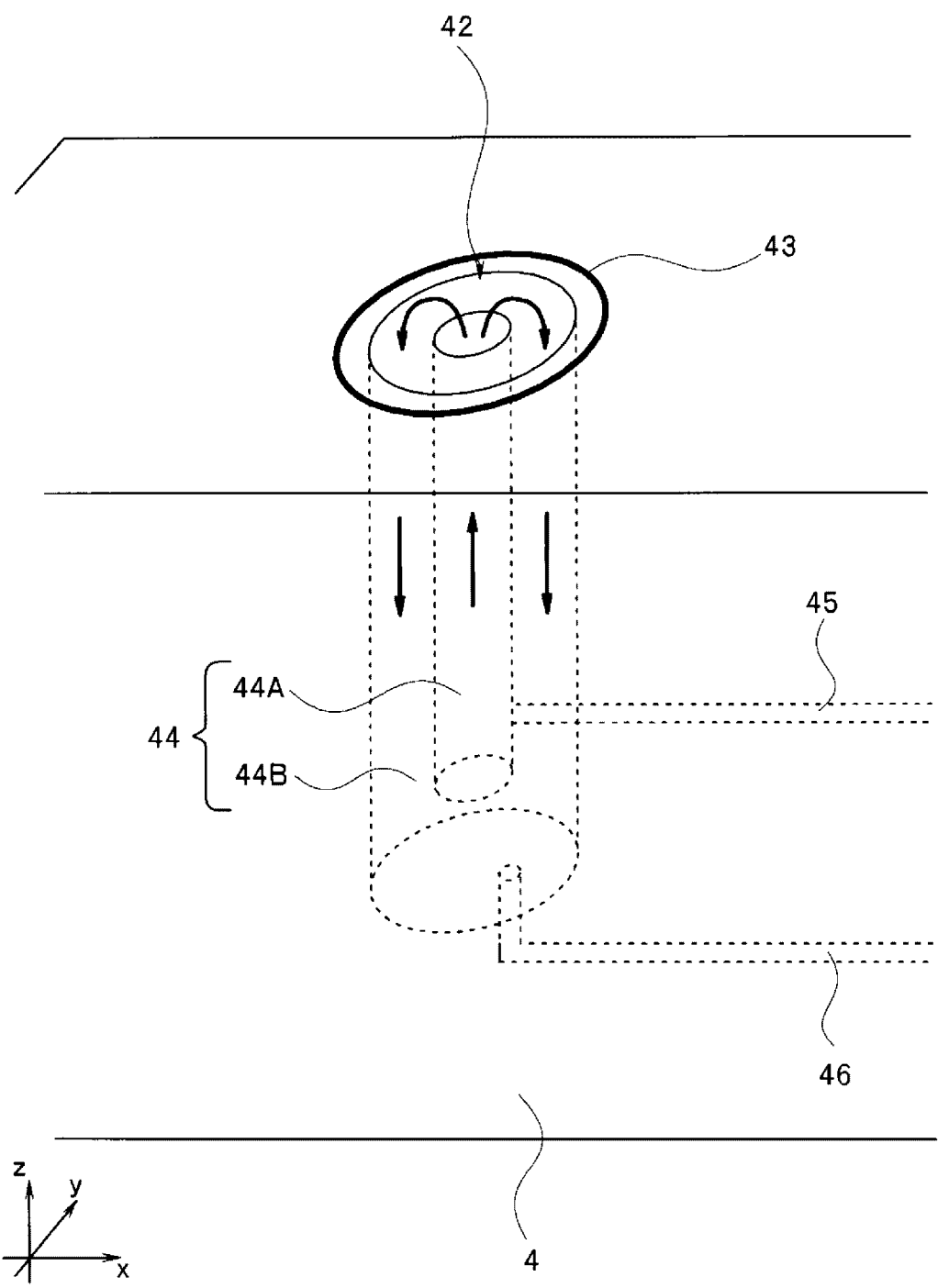
FIG. 3 is a schematic diagram showing an example of a structure of a substrate removing/cleaning unit (remover) according to the first embodiment.

Here, an example of the configuration of the substrate removing/cleaning unit 41 in a case of performing the substrate removal by wet etching will be described. FIG. 3 is a schematic diagram showing an example of the structure of the substrate removing/cleaning unit according to the first embodiment. As shown in FIG. 3, the substrate removing/cleaning unit 41 is configured with a double pipe 44 formed by concentrically disposing a chemical liquid discharge pipe 44A, which is configured with a hollow pipe extending in the z direction, inside a drain pipe 44B which is configured with a hollow pipe extending in the z direction. One end of the chemical liquid discharge pipe 44A on the lower side in the z direction is closed. Further, one end of the drain pipe 44B on the lower side in the z direction is also closed.

One end of a chemical liquid supply pipe 45 is connected to the chemical liquid discharge pipe 44A. The other end of the chemical liquid supply pipe 45 is connected to a chemical liquid supply unit (not shown), and a chemical liquid for etching is supplied from the chemical liquid supply unit to the chemical liquid discharge pipe 44A through the chemical liquid supply pipe 45. The chemical liquid supplied to the chemical liquid discharge pipe 44A is discharged upward in the z direction through the chemical liquid discharge pipe 44A. That is, the chemical liquid is discharged toward the lower surface (the substrate 5B) of the subject 5 disposed above the opening 42.

Further, one end of a drainage pipe 46 is connected to the drain pipe 44B. The other end of the drainage pipe 46 is connected to a drainage unit (not shown). The chemical liquid discharged from the chemical liquid discharge pipe 44A flows downward in the z direction through the interior of the drain pipe 44B (the space between the outer wall of the chemical liquid discharge pipe 44A and the inner wall of the drain pipe 44B) and is discharged to the drainage unit through the drainage pipe 46. A thick line with an arrow in FIG. 3 indicates the flow of the chemical liquid in the double pipe 44.

The substrate 5B coated with the chemical liquid by the discharge from the chemical liquid discharge pipe 44A is etched at a predetermined rate. Therefore, the thickness of the substrate 5B can be reduced according to the discharge time of the chemical liquid. For the processing of the subject 5, a chemical liquid having a high etching rate for the substrate 5B is used. When the substrate 5B is Si (silicon), for example, a mixed solution of hydrogen fluoride (HF) and nitric acid ($HNO_3$), or the like is used as the chemical liquid. It is desirable to use a chemical liquid having not only a high etching rate for the substrate 5B but also a low etching rate for the thin film 5A.

As the subject 5, a subject having a barrier film 5C formed between the substrate 5B and the thin film 5A may be used. By forming an appropriate barrier film 5C in advance, it is possible to prevent over-etching when etching the substrate 5B and reduce damage to the thin film 5A due to etching. The material of the barrier film 5C is selected according to the material of the thin film 5A or the substrate 5B, the etching method, and the like. For example, when the thin film 5A is CoSi (cobalt silicide), the substrate 5B is Si (silicon), the etching method is wet etching, and the chemical liquid which is used is a mixed solution of hydrogen fluoride (HF) and nitric acid ($HNO_3$), the barrier film 5C may be formed of a material having a low etching rate with respect to the mixed solution of hydrogen fluoride (HF) and nitric acid ($HNO_3$), such as SiN (silicon nitride). Further, for example, even if the thin film 5A and the substrate 5B have the configurations described above, when the etching method is dry etching using a laser, the barrier film 5C may be formed of metal having a high reflectivity, such as Al (aluminum).

Further, in order to reduce the strain of the subject 5 (particularly the thin film 5A) due to etching and improve the workability of the etching, a subject having a supporting substrate (not shown) attached to the surface of the thin film 5A may be used as the subject 5. In this case, it is favorable if a supporting substrate made of a material (for example, a cellophane film or the like) that does not contain an element to be analyzed and transmits X-rays during analysis is used, the adhesion with the thin film 5A need not be particularly considered.

For example, in a case of performing mechanical etching using a polishing pad such as chemical mechanical polishing (hereinafter referred to as CMP), the subject 5 is fixed to a holder (carrier) through a supporting substrate attached to the upper surface of the thin film 5A. Then, in a state where the surface on the substrate 5B side of the subject 5 is pressed against a polishing pad having a larger area than the subject 5, the polishing pad is rotated at high speed while supplying a polishing liquid (slurry) containing an abrasive between the subject 5 and the polishing pad. In this way, the entire surface of the substrate 5B is mechanically etched. When performing etching using such CMP, if the adhesion between the supporting substrate and the surface (thin film 5A) to which the supporting substrate is attached is low, it becomes difficult to properly press the subject 5 against the polishing pad, and it becomes difficult to perform the etching itself. That is, it is desired to use a supporting substrate having high adhesion to the thin film 5A.

In contrast, in the case of the mechanical etching in at least one embodiment, since only the substrate 5B under the inspection region of the subject 5 need be polished, a polishing pad having an area smaller than that of the subject 5 is used. Further, since the subject 5 is fixed by the sample holding unit 6, it is possible to press the polishing pad against the substrate 5B without a supporting substrate. Therefore, in at least one embodiment, since the supporting substrate is used for the purpose of preventing strain of the thin film 5A during polishing, it is not necessary to take into account the adhesion with the thin film 5A. Therefore, the degree of freedom when selecting the material of the supporting substrate increases, and mechanical etching can be reliably performed. Since the supporting substrate is attached to the surface of the thin film 5A, it is desired to use a material that does not contain an element to be analyzed and transmits X-rays during analysis. For example, a cellophane film or the like may be used as the supporting substrate.

The substrate removing/cleaning unit 41 may have a configuration capable of performing any one of the above-described etching methods (dry etching, wet etching, and mechanical etching), or may have a configuration capable of executing a plurality of methods. For example, the substrate removing/cleaning unit 41 may have both a mechanism that performs mechanical etching and a mechanism that performs wet etching, and after etching by the mechanical etching is performed until the thickness of the substrate 5B under the thin film 5A becomes about 100 microns, the remaining substrate 5B may be removed by the wet etching. The operation of the substrate removing/cleaning unit 41 is executed based on an instruction which is input from the information processing device 9.

The pressure sensor 84 monitors the pressure in the processing chamber 4. The pressure value is output to the pressure control unit 7.

Figure 4:
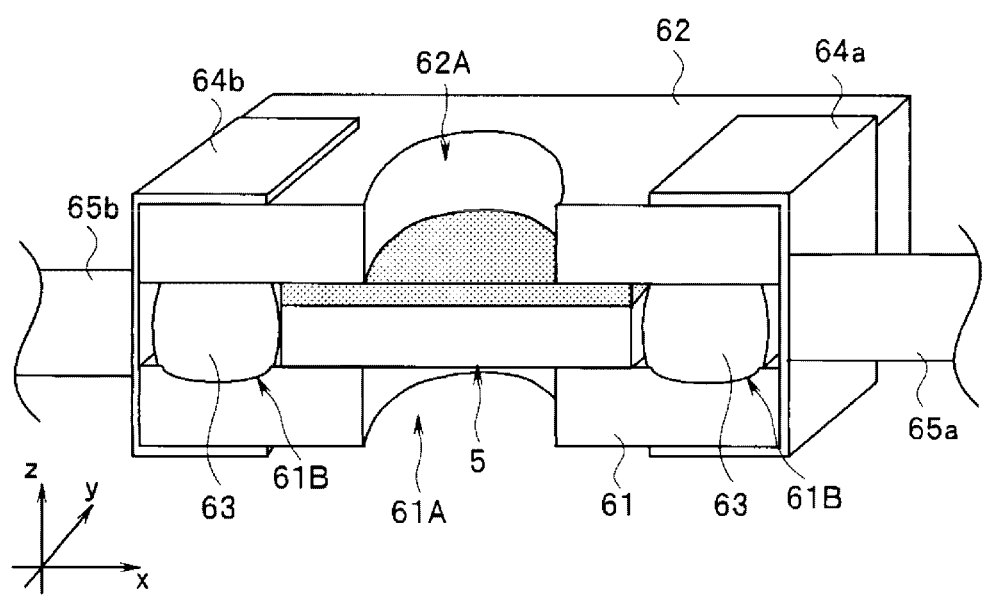
FIG. 4 is a perspective view showing an example of a structure of a sample holding unit (holder) according to the first embodiment.

Next, the sample holding unit 6 will be described. FIG. 4 is a perspective view showing an example of the structure of the sample holding unit according to the at least one embodiment. The sample holding unit 6 shown in FIG. 4 includes a lower holding plate 61, an upper holding plate 62, a seal member 63, clamps 64a and 64b, and holding props 65a and 65b.

The lower holding plate 61 is a flat plate on which the subject 5 can be placed, and an opening 61A for the processing of the subject 5 is provided substantially at the center of the flat plate. Further, a groove 61B for fitting the seal member 63 is formed around the opening 61A. The upper holding plate 62 is a flat plate having a size capable of covering the entire subject 5. An opening 62A for the measurement of the subject 5 is provided substantially at the center of the flat plate. The openings 61A and 62A provided in the lower holding plate 61 and the upper holding plate 62 are smaller than the size of the subject 5 and include the inspection region. For example, when the size of the subject 5 is several centimeters square and the size of the inspection region is 100 microns square, the size of each of the openings 61A and 62A is formed in a range of about several millimeters square to one centimeter square.

The seal member 63 is provided between the lower holding plate 61 and the upper holding plate 62. The seal member 63 is an elastic member such as an O-ring, for example. By fitting the seal member 63 into the groove 61B formed in the lower holding plate 61 and crushing the seal member 63 with the upper holding plate 62 from above in the z direction, repulsive forces are generated between the seal member 63 and the lower holding plate 61 and between the seal member 63 and the upper holding plate 62. Due to the repulsive forces, the seal member 63 and the lower holding plate 61, the seal member 63 and the upper holding plate 62, and the seal member 63 and the subject 5 are brought into close contact with each other.

The clamps 64a and 64b are members that clamp and fix the lower holding plate 61 and the upper holding plate 62 from above and below in the z direction. The clamp 64a clamps one side (first side) of the lower holding plate 61 extending in the y direction and one side (second side) of the upper holding plate 62 extending in the y direction and facing the first side in the z direction. The clamp 64b clamps one side (third side) of the lower holding plate 61 extending in the y direction and facing the first side in the x direction and one side (fourth side) of the upper holding plate 62 extending in the y direction and facing the third side in the z direction. By clamping the lower holding plate 61 and the upper holding plate 62 with the two clamps 64a and 64b face each other in the x direction, the subject 5 is fixed between the lower holding plate 61 and the upper holding plate 62. The configurations of the clamps 64a and 64b are not limited to the configuration described above, and any configuration may be adopted as long as it is a configuration in which the upper holding plate 62 and the lower holding plate 61 can be fixed so as not to be displaced from each other.

The holding prop 65a is a substantially columnar member that is connected to the clamp 64a and extends rightward in the x direction from the clamp 64a. The holding prop 65b is a substantially columnar member that is connected to the clamp 64b and extends leftward in the x direction from the clamp 64b. The holding props 65a and 65b are connected to a holding unit driving mechanism 10 and are movable in three directions: the x direction, the y direction, and the z direction. That is, by moving the holding props 65a and 65b, it is possible to move the inspection region, which is the range of the subject 5 which is irradiated with the X-rays. After the opening 42 of the processing chamber 4 is covered with the subject 5 and the sample holding unit 6 and positioning in the x and y directions is performed such that the inspection region is set at the X-ray irradiation position, by moving the holding prop 65a downward in the z direction such that the lower surface of the lower holding plate 61 and the seal member 43 of the processing chamber 4 come into close contact with each other, the analyzing chamber 3 and the processing chamber 4 are configured as independent closed spaces.

Further, the holding props 65a and 65b are made to be rotatable by 180 degrees with the x axis as a central axis by the holding unit driving mechanism (driver) 10. That is, by rotating the holding props 65a and 65b by 180 degrees, it is possible to turn the substrate 5B and the thin film 5A of the subject 5 upside down. Normally, the thin film 5A is disposed on the upper side in the z direction. However, by rotating the holding props 65a and 65b by 180 degrees, it is possible to dispose the substrate 5B on the upper side in the z direction. That is, the analysis from the substrate 5B side also becomes possible.

The information processing device 9 is, for example, a computer, and includes a central processing unit (CPU) 91 and a RAM 92. The information processing device 9 analyzes data which is input from the diffracted/reflected X-ray detection unit 33 to detect the processing end point of the subject 5, and controls the operation of the substrate removing/cleaning unit 41 or instructs a pressure setting unit 8 of the pressure setting values of the analyzing chamber 3 and the processing chamber 4. Further, the information processing device 9 analyzes data which is input from the fluorescent X-ray detection unit 32 to analyze the composition of the thin film 5A. Further, the information processing device 9 instructs the holding unit driving mechanism 10 of the position of the sample holding unit 6, a reversing operation, or the like. The CPU 91 operates according to a program stored in a memory (not shown) and executes the above-described analysis or the instruction to each part. The RAM 92 stores data which is input from the analyzing and processing chamber 2 or stores the composition analysis result of the thin film 5A.

The pressure control unit 7 individually controls the pressures in the analyzing chamber 3 and the processing chamber 4 according to the instruction which is input from the pressure setting unit 8. The pressure control unit 7 may include two vacuum pumps 713 and 714 and two gas supply units 723 and 724. The vacuum pumps 713 and 714 suck the gas in the analyzing chamber 3 and the processing chamber 4, respectively, to reduce the pressures in the chambers. The gas supply units 723 and 724 send gas into the analyzing chamber 3 and the processing chamber 4, respectively, to increase the pressures in the chambers. An inert gas such as nitrogen gas or argon gas may be used as the gas which is supplied from the gas supply units 723 and 724.

The vacuum pump 713 and the gas supply unit 723 are connected to the analyzing chamber 3. A particle detector 733 is provided in the middle of the pipe connecting the vacuum pump 713 and the analyzing chamber 3. A flow rate sensor 743 is provided in the middle of the pipe connecting the gas supply unit 723 and the analyzing chamber 3. The vacuum pump 714 and the gas supply unit 724 are connected to the processing chamber 4. A particle detector 734 is provided in the middle of the pipe connecting the vacuum pump 714 and the processing chamber 4. A flow rate sensor 744 is provided in the middle of the pipe connecting the gas supply unit 724 and the processing chamber 4. The operations of the vacuum pumps 713 and 714 and the gas supply units 723 and 724 can be independently controlled. Therefore, the pressures in the analyzing chamber 3 and the processing chamber 4 can be independently controlled. The detection results of the particle detectors 733 and 734 and the measurement values of the flow rate sensors 743 and 744 are output to the pressure control unit 7.

That is, the pressure control unit 7 controls the operations of the vacuum pumps 713 and 714 and the gas supply units 723 and 724 while referring to the measurement values of the pressure sensors 83 and 84 such that each of the analyzing chamber 3 and the processing chamber 4 has the pressure setting value input from the pressure setting unit 8. When the detection of the strain of the thin film 5A is input from the thin film strain detection unit 34, the pressure control unit 7 controls the operations of the vacuum pumps 713 and 714 and the gas supply units 723 and 724 to adjust the pressure balance between the analyzing chamber 3 and the processing chamber 4 such that the strain of the thin film 5A is reduced. For example, when a convex strain is detected on the surface of the thin film 5A, the operations of the vacuum pumps 713 and 714 and the gas supply units 723 and 724 are adjusted such that the pressure in the analyzing chamber 3 becomes a positive pressure slightly higher than the pressure in the processing chamber 4.

The pressure setting unit 8 determines the pressure setting value of the analyzing chamber 3 and the pressure setting value of the processing chamber 4 according to the instruction which is input from the information processing device 9. The pressure setting value is variable from atmospheric pressure to vacuum. The determined pressure setting value is output to the pressure control unit 7. Specifically, when an instruction to perform the processing of the subject 5 in the analyzing and processing chamber 2 is input, the pressure setting values are determined such that the pressure in the analyzing chamber 3 becomes atmospheric pressure and the pressure in the processing chamber 4 becomes a negative pressure slightly smaller than atmospheric pressure. The setting of the pressure in the processing chamber 4 to a negative pressure slightly smaller than the pressure in the analyzing chamber 3 prevents etching products, such as dust which is generated when the substrate 5B is etched in the processing chamber 4, from contaminating the analyzing chamber 3.

Further, when an instruction to perform the analysis of the composition of the thin film 5A in the analyzing and processing chamber 2 is input, the pressure setting values of both the analyzing chamber 3 and the processing chamber 4 are set to vacuum. The fluorescent X-rays which are emitted from the thin film 5A during the XRF measurement have low energy and are easily absorbed by the gas in the analyzing chamber 3. Therefore, in order to improve the detection accuracy, it is desirable to make the inside of the analyzing chamber 3 vacuum. At this time, if the pressure difference between the processing chamber 4 and the analyzing chamber 3 is large, there is a concern that a large pressure may be applied to the subject 5 located at the boundary between both the chambers, resulting in damage. For this reason, the pressure in the processing chamber 4 and the pressure in the analyzing chamber 3 desirably are substantially equal to each other, and therefore, the pressure setting values of both the analyzing chamber 3 and the processing chamber 4 are set to vacuum.

That is, the pressures in the analyzing chamber 3 and the processing chamber 4 are basically set to the same pressure. The specific setting value is set to an appropriate value between atmospheric pressure and vacuum according to a processing method or processing condition and an analysis method or an analysis conditions. However, when the processing of the subject 5 is performed in the processing chamber 4, the pressure in the processing chamber 4 is set to a negative pressure slightly smaller than the pressure in the analyzing chamber 3.

Figure 5:
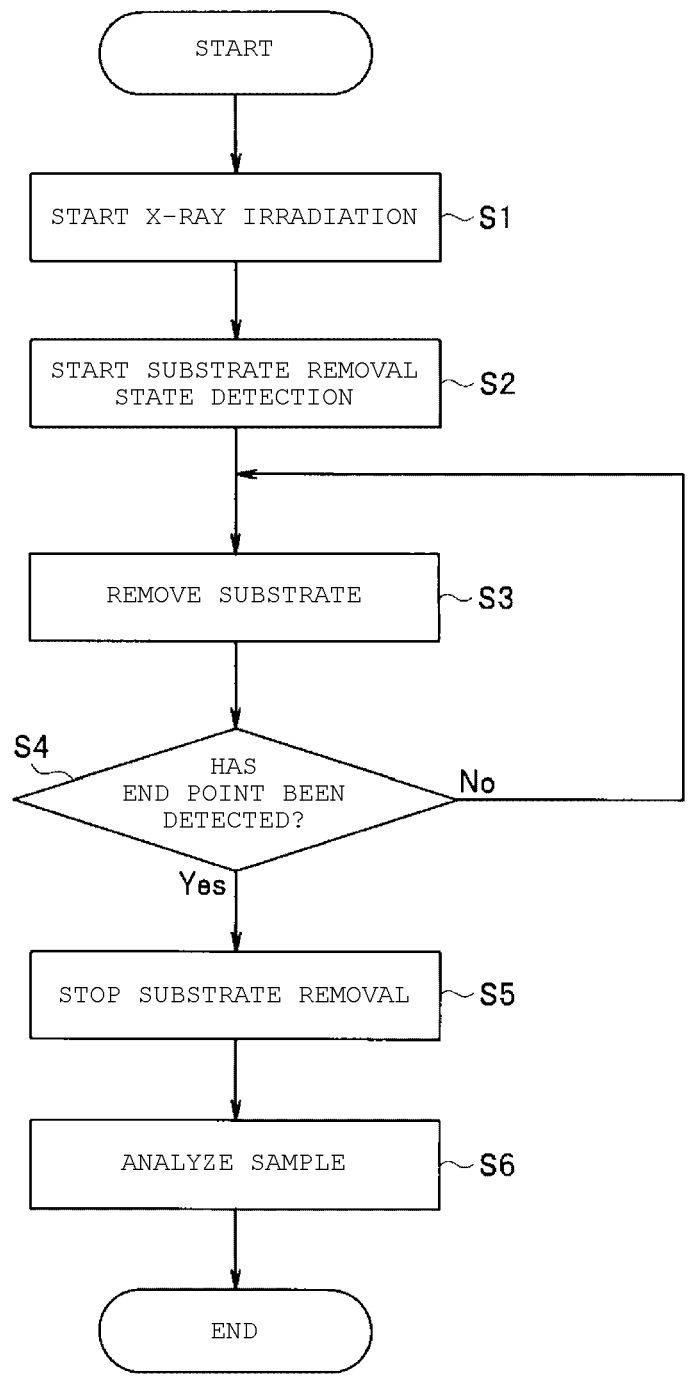
FIG. 5 is a flowchart describing sample processing/analysis processing.

Next, the procedure of a thin film analyzing method in this embodiment will be described. FIG. 5 is a flowchart describing the sample processing/analysis processing. First, prior to the procedure of FIG. 5, the subject 5 is set on the sample holding unit 6, and the sample holding unit 6 is disposed such that the substrate 5B under the inspection region of the thin film 5A is exposed from the opening 42 of the processing chamber 4 and the lower holding plate 61 of the sample holding unit 6 and the seal member 63 come into close contact with each other. That is, a state is created where each of the analyzing chamber 3 and the processing chamber 4 has airtightness and the pressure control can be performed independently.

In this state, X-ray irradiation from the X-ray irradiation unit 31 to the inspection region of the thin film 5A is started (S1). Subsequently, monitoring of the removal state of the substrate 5B under the inspection region is started (S2). Specifically, in the information processing device 9, the data which is input from the fluorescent X-ray detection unit 32 and the diffracted/reflected X-ray detection unit 33 is analyzed, and the peak intensity of the fluorescent X-rays which are detected by the fluorescent X-ray detection unit 32, or the diffraction peak intensity of the diffracted X-rays or the reflected X-rays which are detected by the diffracted/reflected X-ray detection unit 33 is monitored. When the crystal structures of the thin film 5A and the substrate 5B are different from each other (for example, when the thin film 5A made of CoSi is formed on the surface of the substrate 5B made of single crystal silicon), the detection result (fluorescent X-ray peak intensity or diffraction peak intensity relating to the element constituting the substrate, and the degree of change thereof) differs between a case where the substrate 5B is formed under the thin film 5A and a case where the substrate 5B is removed and only the thin film 5A is formed. Therefore, the removal state of the substrate 5B can be monitored by detecting the fluorescent X-rays, the diffracted X-rays, and the reflected X-rays and monitoring the peak intensity.

For example, during the period from the start of removal of the substrate 5B to the remaining amount (thickness) of about 10 nm, the diffracted X-rays or the reflected X-rays are detected and the diffraction peak intensity is monitored. If the remaining amount of the substrate 5B decreases (for example, if the thickness becomes about 10 nm), the diffracted X-ray peak intensity changes. At this point in time, the monitoring is switched to the monitoring of the X-ray peak intensity of the element (for example, Si) of the substrate 5B. The X-ray peak intensity of the element (for example, Si) of the substrate 5B decreases as the removal of the substrate 5B progresses. If the substrate 5B is completely removed, the degree of decrease in peak intensity becomes small. In this manner, by performing the end point detection by a plurality of methods such as the XRD/XRR and the XRF, it is possible to select an optimum end point detection method according to the remaining film thickness, and it is possible to improve the end point detection accuracy.

Next, the substrate 5B under the inspection region is removed (S3). Specifically, the substrate removing/cleaning unit 41 is driven according to the instruction from the information processing device 9, and the substrate 5B under the inspection region exposed from the opening 42 is etched from the lower side in the z direction. When the substrate removing/cleaning unit 41 has a configuration capable of executing a plurality of etching methods, the substrate removal in S3 is executed by the method instructed from the information processing device 9. Even in a case of combining two or more methods, similarly, etching is executed according to the recipe instructed from the information processing device 9.

Even while the substrate 5B is being removed in S3, the monitoring for the detection of the removal state of the substrate 5B in S2 is continuously executed. That is, while the substrate 5B is etched in the processing chamber 4, in the analyzing chamber 3, the thin film 5A is irradiated with X-rays and the fluorescent X-rays, the diffracted X-rays, and the reflected X-rays which are generated from the thin film 5A are detected. That is, in at least one embodiment, the removal state of the substrate 5B can be monitored in-situ in the analyzing chamber 3 while the removal of the substrate 5B is performed in the processing chamber 4.

When it is determined that the substrate 5B is completely removed and only the thin film 5A remains (S4, Yes), the information processing device 9 instructs the substrate removing/cleaning unit 41 to stop the driving. The substrate removing/cleaning unit 41 stops the removal of the substrate 5B according to the input instruction, and ends the processing of the subject 5 (S5). When it is determined that the substrate 5B remains under the thin film 5A (S4, No), the substrate removal in S3 is continued while performing the monitoring in S2.

After the processing of the substrate 5B is ended, the analysis of the composition of the thin film 5A is performed as it is (S6). That is, the analysis can be performed in-situ without moving or re-installing the processed subject 5 for analysis. Further, since the X-ray irradiation unit 31 or the fluorescent X-ray detection unit 32 in the analyzing chamber 3 is used for both end point detection at the time of the removal of the substrate 5B and analysis of the composition of the thin film 5A, the analyzing device can be implemented with a simple configuration.

In the above description, the removal of the substrate 5B in the inspection region of the subject 5 is performed in the entirety of the analyzing and processing chamber 2. However, pre-etching may be performed using an external processing device before mounting the subject 5 on the thin film analyzing device. For example, after dry etching is performed using an external etching device until the remaining film thickness of the substrate 5B under the thin film 5A is about 100 microns, the subject 5 is mounted on the thin film analyzing device of this embodiment, and then the substrate 5B may be completely removed.

Further, the determination of the end point of the substrate processing may be performed more strictly as follows. For example, in the final stage of the processing of the substrate 5B (the stage where the remaining film thickness becomes acidic), the processing is temporarily stopped, the holding unit driving mechanism 10 is operated to invert the sample holding unit 6 by 180 degrees about the y-axis and invert the upper and lower surfaces of the subject 5. That is, the substrate 5B is exposed to the analyzing chamber 3 side, and the thin film 5A is exposed to the processing chamber 4 side. In this state, X-rays are made to be incident on the substrate 5B from the X-ray irradiation unit 31 at an extremely low angle, and the XRR analysis is performed by detecting the reflected X-rays by the diffracted/reflected X-ray detection unit 33, or total reflection X-ray fluorescence analysis (Total Reflection X-ray Fluorescence: TXRF) is performed by detecting the reflected X-rays with the fluorescent X-ray detection unit 32, whereby the remaining film thickness of the substrate 5B is strictly checked in units of several angstroms. After the analysis, the sample holding unit 6 is inverted again and returned to the original state. When it is determined that the substrate 5B has been completely removed (there is no remaining substrate), the substrate removal is ended and analysis is performed. When the remaining of the substrate 5B is detected, the removal of the substrate 5B and the above-described analysis for the end point detection are repeated.

Figure 6:
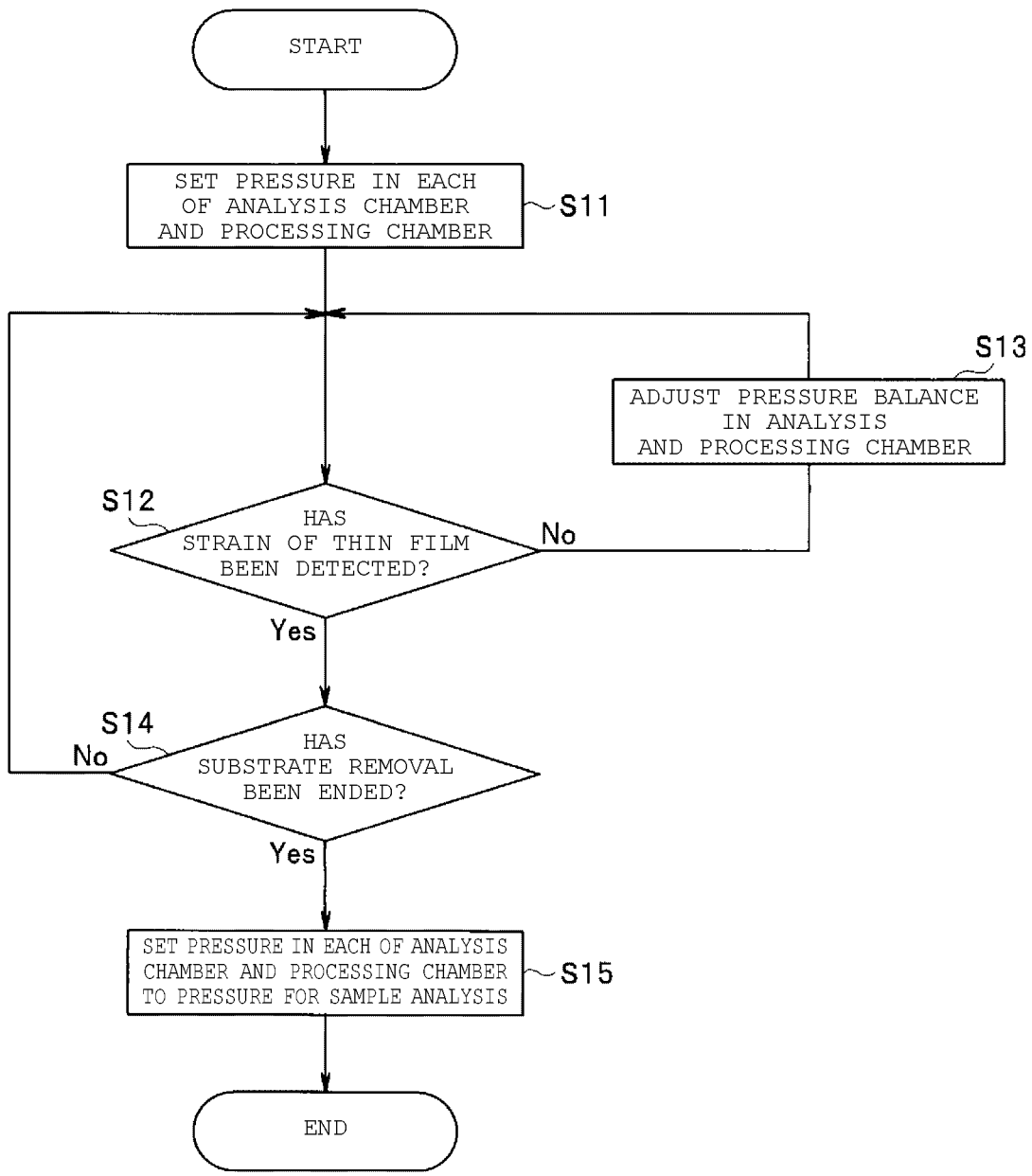
FIG. 6 is a flowchart describing processing of adjusting the pressure in an analyzing and processing chamber during a sample processing process.

In the analyzing and processing chamber 2, in order to execute the procedure of an example of processing-analysis in-situ without damaging the subject 5, it is important to control the pressures in the analyzing chamber 3 and the processing chamber 4. FIG. 6 is a flowchart describing processing of adjusting the pressure in the analyzing and processing chamber during a sample processing process.

First, prior to the processing of the substrate 5B, the pressure in each of the analyzing chamber 3 and the processing chamber 4 is set (S11). Specifically, if an instruction to perform the processing of the substrate 5B is input from the information processing device 9 to the pressure setting unit 8, the pressure setting unit 8 determines the pressure setting value such that the pressure in the analyzing chamber 3 becomes a pressure according to the processing method and the pressure in the processing chamber 4 becomes a negative pressure slightly smaller than the pressure in the analyzing chamber 3. The pressure setting unit 8 outputs the pressure setting value to the pressure control unit 7. The pressure control unit 7 appropriately operates the two vacuum pumps 713 and 714 and the two gas supply units 723 and 724 such that the pressure in each of the analyzing chamber 3 and the processing chamber 4 becomes the input pressure setting value. S11 is executed before S2 in FIG. 5.

Subsequently, if the removal of the substrate 5B is started by S3 in FIG. 3, the thin film strain detection unit 34 monitors the strain of the thin film 5A. When the strain of the thin film 5A has been detected (S12, Yes), the pressure control unit 7 adjusts the pressure balance of the analyzing and processing chamber 2 (S13). Specifically, the pressure in the chamber in which the thin film 5A is convexly distorted is set to a positive pressure higher than the pressure in the other chamber. For example, when the thin film 5A is distorted convexly toward the analyzing chamber 3 side, the gas supply amount of the gas supply unit 723 is adjusted to be slightly larger to increase the pressure in the analyzing chamber 3. In this way, the strain of the thin film 5A is reduced, so that the flatness can be improved and the processing accuracy can be improved. After the pressure adjustment in the analyzing and processing chamber is ended, subsequently, the pressure control unit 7 controls the pressures in the analyzing chamber 3 and the processing chamber 4 so as to be maintained at appropriate values, respectively.

When the processing of the substrate 5B progresses and the removal of the substrate 5B under the thin film 5A is ended (S14, Yes), the pressure in each of the analyzing chamber 3 and the processing chamber 4 is set to a pressure at the time of analysis of the thin film 5A (S15). Specifically, when an instruction to perform the analysis of the composition of the thin film 5A is input from the information processing device 9 to the pressure setting unit 8, the pressure setting unit 8 sets the pressure setting value of both the analyzing chamber 3 and the processing chamber 4 to vacuum. The pressure setting unit 8 outputs the pressure setting value to the pressure control unit 7. The pressure control unit 7 appropriately operates the two vacuum pumps 713 and 714 and the two gas supply units 723 and 724 such that the pressure in each of the analyzing chamber 3 and the processing chamber 4 becomes the input pressure setting value.

The analyzing chamber 3 and the processing chamber 4 of this embodiment are connected to each other through the opening 42. At the time of the processing and the analysis, the analyzing chamber 3 and the processing chamber 4 become independent closed spaces by installing the subject 5 in the opening 42. With such a configuration, if the pressure difference between the processing chamber 4 and the analyzing chamber 3 is large, there is a concern that the subject 5 located at the boundary between both the chambers may be damaged due to a large pressure. Therefore, the pressures in the analyzing chamber 3 and the processing chamber 4 are controlled so as to become basically the same pressure (be within at least a range of a pressure difference that does not affect the subject 5).

In this manner, in the thin film analyzing device of at least one embodiment, when it is desired to remove the substrate 5B under the thin film 5A prior to the analysis when performing the analysis of the composition of the thin film 5A formed on the substrate 5B, the removal of the substrate 5B and the analysis of the thin film 5A can be performed in the same analyzing and processing chamber 2. The analyzing and processing chamber 2 has the analyzing chamber 3 and the processing chamber 4, which are connected to each other through the opening 42. In addition to the fluorescent X-ray detection unit 32 which is used for the analysis of the composition of the thin film 5A, the diffracted/reflected X-ray detection unit 33 which is used for the endpoint detection during processing is installed in the analyzing chamber 3. By installing the subject 5 in the opening 42 that is the boundary between the analyzing chamber 3 and the processing chamber 4, the analyzing chamber 3 and the processing chamber 4 become closed spaces and can be independently controlled in atmospheres or pressures.

Therefore, by installing the subject 5 in the analyzing and processing chamber 2 such that the thin film 5A is exposed to the analyzing chamber 3 side and the substrate 5B is exposed to the processing chamber 4 side, it is possible to detect the end point in the analyzing chamber 3 while removing the substrate 5B in the processing chamber 4. After the processing is ended, in a state where the subject 5 is left as it is, the analysis of the composition of the thin film 5A can be performed in the analyzing chamber 3. That is, the composition of the thin film 5A formed on the substrate 5B can be analyzed accurately and efficiently.

Second Embodiment

Next, a thin film analyzing device according to a second embodiment will be described. A thin film analyzing device 1' of this embodiment is different from the thin film analyzing device of the above-described first embodiment in that an analyzing and processing chamber 2' is not divided into the analyzing chamber 3 and the processing chamber 4 and is configured with a single chamber. Hereinafter, the same elements as those in the first embodiment will be denoted by the same reference numerals, and detailed description thereof will be omitted.

Figure 7:
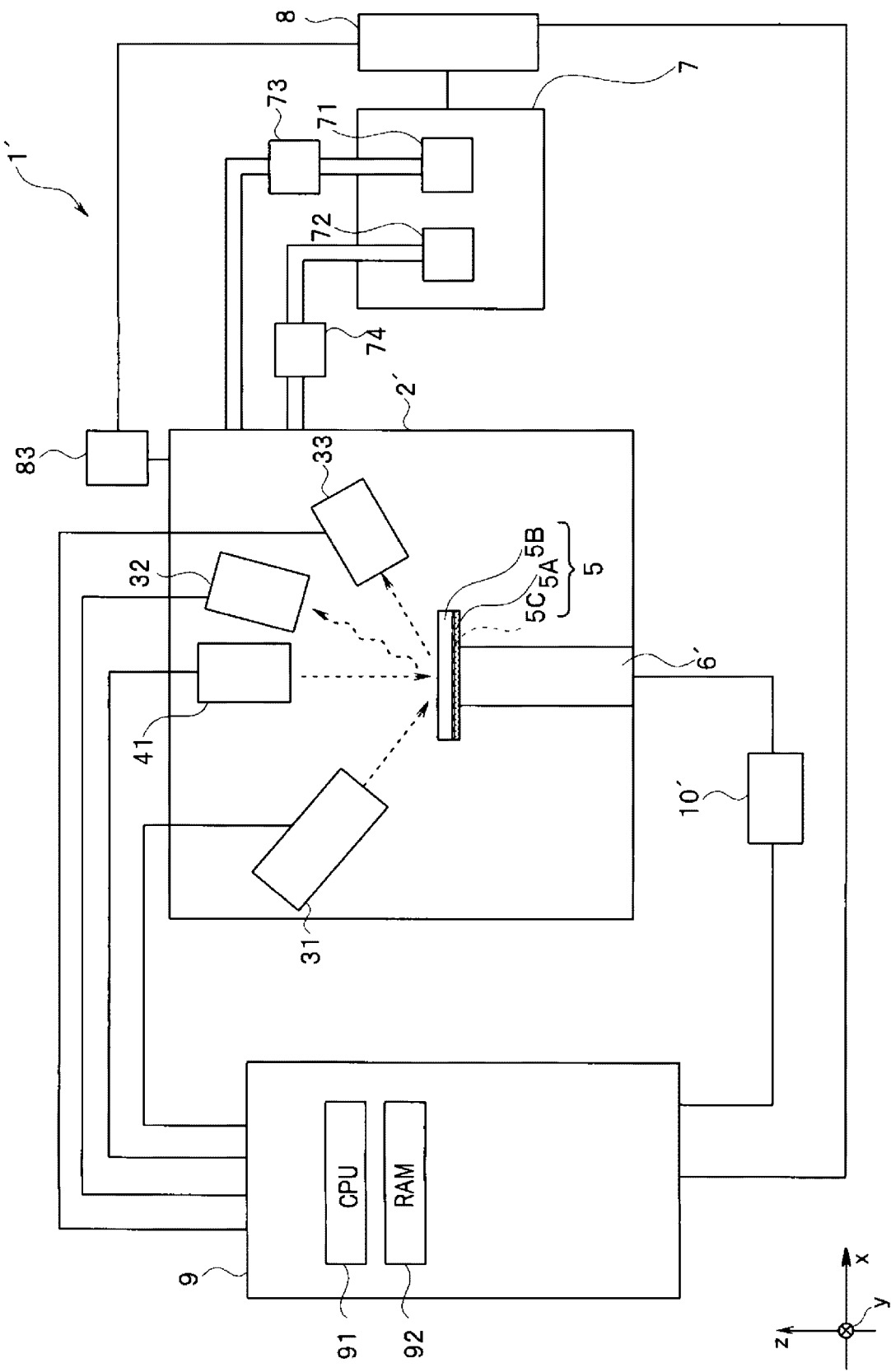
FIG. 7 is a block diagram showing a configuration example of a thin film analyzing device according to a second embodiment.

FIG. 7 is a block diagram showing a configuration example of the thin film analyzing device according to the second embodiment. The analyzing and processing chamber 2' of the thin film analyzing device 1' of this embodiment includes the X-ray irradiation unit 31, the fluorescent X-ray detection unit 32, the diffracted/reflected X-ray detection unit 33, the substrate removing/cleaning unit 41, and a sample holding unit 6'. Among them, the configuration of the sample holding unit 6' and the installation position of the substrate removing/cleaning unit 41 are different from those in the first embodiment.

The sample holding unit 6' is a rotary stage to which the subject 5 can be detachably mounted, and is mounted on the lower surface in the z direction of the analyzing and processing chamber 2'. The subject 5 can be moved in two orthogonal directions (x direction and y direction) parallel to the surface of the stage by a holding unit driving mechanism 10'. By moving the sample holding unit 6' in the x direction and/or the y direction, it is possible to move the inspection region on the thin film 5A, which is a range irradiated with the X-rays. Further, the stage can be rotated and scanned at high speed.

The subject 5 is placed on the sample holding unit 6' such that the thin film 5A side becomes the lower side in the z direction and the substrate 5B side becomes the upper side in the z direction. Before the subject 5 is placed on the sample holding unit 6', a protective supporting substrate (not shown) may be attached to the surface of the thin film 5A, as necessary.

The substrate removing/cleaning unit 41 is installed above the subject 5 in the z direction. That is, the X-ray irradiation unit 31, the fluorescent X-ray detection unit 32, the diffracted/reflected X-ray detection unit 33, and the substrate removing/cleaning unit 41 are all installed on the same side (upper side in the z direction) with respect to the subject 5.

Since the analyzing and processing chamber 2' is configured with a single chamber, it is not necessary to separately control the pressures in the analyzing chamber 3 and the processing chamber 4 as in the first embodiment. Therefore, only one vacuum pump 72 and only one gas supply unit 73 may be installed in the pressure control unit 7.

Next, a thin film analyzing method in at least one embodiment will be described. The subject 5 is installed on the sample holding unit 6' with the substrate 5B side located on the upper side in the z direction. Whether or not the substrate 5B remains is monitored while the substrate 5B is processed (etched) by the substrate removing/cleaning unit 41. The determination as to whether or not the substrate remains is the same as in the first embodiment. At the point in time when the removal of the substrate 5B is ended (the end point is detected), the substrate removing/cleaning unit 41 is stopped and the XRF analysis is performed. Also in this embodiment, similarly to the first embodiment, since the processing and analysis of the sample can be performed in the same analyzing and processing chamber 2', the analysis can be performed efficiently. Further, since it is possible to perform the processing or the analyzed while scanning and rotating the subject 5 at high speed, the substrate 5B can be uniformly removed over the entire inspection region. Further, since it is also possible to remove diffraction lines derived from the thin film 5A during XRF measurement, more accurate analysis becomes possible.

The subject 5 processed (with the substrate 5B under the inspection region removed) by the thin film analyzing device of this embodiment can be provided not only to the subsequent in-situ analysis but also to another inspection device in order to perform analysis by a transmission measurement method. More specifically, the subject 5 from which the substrate 5B under the inspection region has been removed by the thin film analyzing device of this embodiment can also be provided to another inspection device in order to perform subsequent analysis, for example, analysis by an infrared spectroscopy (IR) or an X-ray absorption fine structure (XAFS).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A thin film analyzing device, comprising:
a processing and analyzing chamber for performing processing and analyzing of a subject, the subject including a semiconductor substrate and a thin film formed on the semiconductor subject,
wherein the processing and analyzing chamber includes:
a holder arranged to hold the subject;
an X-ray irradiation source arranged to irradiate the thin film of the subject with X-rays;
a fluorescent X-ray detector configured to detect fluorescent X-rays which are emitted from the thin film of the subject due to the irradiation of the X-rays;

a diffracted/reflected X-ray detector configured to detected reflected X-rays and diffracted X-rays emitted from the thin film of the subject due to the irradiation of the X-rays; and a substrate remover arranged to remove the semiconductor substrate.

2. The thin film analyzing device according to claim 1, further comprising a strain detector configured to detect strain of the thin film of the subject.

3. The thin film analyzing device according to claim 1, wherein the remover is configured to remove the semiconductor substrate of the subject via one of polishing or etching.

4. The thin film analyzing device according to claim 1, wherein the processing and analyzing chamber has a first chamber and a second chamber, which are connected to each other by an opening, and each of the first chamber and the second chamber is configured as an independent closed space formed by the opening being covered with the holder and the holder being disposed in contact with the opening.

5. The thin film analyzing device according to claim 4, further comprising a seal arranged around the opening and disposed in contact with the holder.

6. The thin film analyzing device according to claim 5, wherein the seal is elastic.

7. The thin film analyzing device according to claim 4, wherein the opening comprises a concentric hollow double pipe.

8. The thin film analyzing device according to claim 7, wherein an inner pipe of the concentric hollow double pipe allows etchant to flow to the semiconductor substrate of the subject.

9. The thin film analyzing device according to claim 4, wherein in a state where the holder is disposed in contact with the opening, either one of a surface on which the thin film is formed, or a back surface of the semiconductor substrate, is exposed to the first chamber, and another surface of the subject is exposed to the second chamber, the surface on which the thin film is formed being a front surface of the subject, the back surface of the semiconductor substrate being a back surface of the subject.

10. The thin film analyzing device according to claim 9, wherein the X-ray irradiation source, the fluorescent X-ray detector, and the diffracted/reflected X-ray detection detector are disposed in the first chamber, and the substrate remover is disposed in the second chamber.

11. The thin film analyzing device according to claim 10, further comprising:

a pressure controller configured to individually adjust a pressure with respect to each of the first chamber and the second chamber.

12. The thin film analyzing device according to claim 1, wherein the holder comprises:

a stage on which the subject is placed, the stage being configured to move in two orthogonal directions within a surface of the stage, the stage being configured to rotate in a direction orthogonal to the surface of the stage as an axis, wherein the X-ray irradiation source, the fluorescent X-ray detector, the diffracted/reflected X-ray detector, and the substrate remover are disposed above the surface of the stage.

13. The thin film analyzing device according to claim 1, wherein the diffracted/reflected X-ray detector is arranged to detect a removal state of the semiconductor substrate by the substrate remover.

14. The thin film analyzing device according to claim 1, wherein the semiconductor substrate is a silicon substrate, and the thin film is a metal film containing silicon.

15. The thin film analyzing device according to claim 1, wherein the subject further includes a barrier film formed between the semiconductor substrate and the thin film.

16. A thin film analyzing method comprising:

covering an opening with a holder configured to hold a subject having a thin film on a semiconductor substrate, and bringing the holder into contact with the opening, in a processing and analyzing chamber having a first chamber and a second chamber, the first chamber and the second chamber being connected to each other through the opening, such that a surface on which the thin film is disposed is exposed to the first chamber and the semiconductor substrate is exposed to the second chamber;

monitoring a removal state of the semiconductor substrate by detecting reflected X-rays and diffracted X-rays, which are generated by X-rays directed to the subject by an X-ray irradiation source and a diffracted/reflected X-ray detector disposed in the first chamber, while removing the semiconductor substrate by a substrate remover disposed in the second chamber; and stopping the removal of the semiconductor substrate when an end point of the removal of the semiconductor substrate is detected, and then performing analysis of the thin film by the X-ray irradiation source and a fluorescent X-ray detector disposed in the first chamber.

17. The thin film analyzing method according to claim 16, further comprising performing the removal by at least one of etching or polishing.

18. The thin film analyzing method according to claim 17, wherein the etching comprises wet etching or dry etching.

19. The thin film analyzing method according to claim 17, wherein the removal is performed by a combination of etching and polishing.

* * * * *